United States Patent
Yu et al.

(10) Patent No.: US 6,319,784 B1
(45) Date of Patent: Nov. 20, 2001

(54) USING HIGH TEMPERATURE H2 ANNEAL TO RECRYSTALLIZE S/D AND REMOVE NATIVE OXIDE SIMULTANEOUSLY

(75) Inventors: Mo-Chiun Yu, Taipei; Syun-Ming Jang, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/318,958

(22) Filed: May 26, 1999

(51) Int. Cl.$^7$ ............ H01L 21/44; H01L 21/4763; H01L 21/336; H01L 21/265
(52) U.S. Cl. ............ 438/301; 438/303; 438/522; 438/523; 438/592; 438/664
(58) Field of Search ............ 438/664, 677, 438/682, 597, 648, 649, 655

(56) References Cited

U.S. PATENT DOCUMENTS

| | | | |
|---|---|---|---|
| 4,522,657 | 6/1985 | Rohatgi et al. | 148/1.5 |
| 5,219,798 | 6/1993 | Kamakura | 437/248 |
| 5,418,184 | 5/1995 | Girisch | 437/135 |
| 5,420,454 | * 5/1995 | Vook et al. | 257/518 |
| 5,595,927 | * 1/1997 | Chen et al. | 438/270 |
| 5,646,057 | 7/1997 | Liu et al. | 437/40 R |
| 5,710,438 | * 1/1998 | Oda et al. | 257/69 |
| 5,728,625 | * 3/1998 | Tung | 438/586 |
| 5,849,634 | * 12/1998 | Iwata | 438/655 |
| 5,851,921 | * 12/1998 | Gardner et al. | 438/655 |
| 5,863,820 | * 1/1999 | Huang | 438/241 |
| 5,891,771 | * 4/1999 | Wu et al. | 438/248 |
| 5,930,618 | * 7/1999 | Sun et al. | 438/240 |
| 5,955,384 | * 9/1999 | Oda | 438/754 |
| 5,982,017 | * 11/1999 | Wu et al. | 257/513 |
| 5,998,251 | * 12/1999 | Wu et al. | 438/241 |
| 5,998,252 | * 12/1999 | Huang | 438/241 |
| 6,004,843 | * 12/1999 | Huang | 438/241 |
| 6,007,671 | * 12/1999 | Fujimura et al. | 156/345 |
| 6,015,730 | * 1/2000 | Wang et al. | 438/241 |
| 6,020,024 | * 2/2000 | Maiti et al. | 427/248.1 |
| 6,057,220 | * 5/2000 | Ajmera et al. | 438/597 |

OTHER PUBLICATIONS

S. Wolf and R.N. Tauber, "Silicon Processing for the VLSI Era", vol. 1, p. 520, Lattice Press, Sunset beach, CA, USA, 1986.*

\* cited by examiner

Primary Examiner—Olik Chaudhuri
Assistant Examiner—Shrinivas H. Rao
(74) Attorney, Agent, or Firm—George O. Saile; Stephen B. Ackerman; Rosemary L. S. Pike

(57) ABSTRACT

A method for simultaneously annealing a source/drain region and removing an overlying native oxide layer using a $H_2$ anneal in the fabrication of integrated circuits is described. Semiconductor device structures are provided in and on a semiconductor substrate wherein the semiconductor device structures include gate electrodes and associated source and drain regions. A resist protective dielectric layer is deposited overlying the semiconductor device structures. The resist protective dielectric layer is etched away where it is not covered by a mask exposing a top surface of the gate electrode and a surface of the semiconductor substrate overlying the source and drain regions wherein a native oxide layer forms on the exposed surfaces. The substrate is annealed using $H_2$ whereby the native oxide is removed and whereby the exposed surface of the semiconductor substrate is recrystallized. Thereafter, a metal layer is deposited overlying the resist protective oxide layer, the exposed surface of the gate electrode, and the exposed surface of the semiconductor substrate and silicided. The metal layer is removed where it is not transformed to a metal silicide leaving the metal silicide overlying the gate, source and drain regions to complete fabrication of the integrated circuit device.

20 Claims, 3 Drawing Sheets

USING HIGH TEMPERATURE H2 ANNEAL TO RECRYSTALLIZE S/D AND REMOVE NATIVE OXIDE SIMULTANEOUSLY

BACKGROUND OF THE INVENTION

(1) Field of the Invention

The present invention relates to the fabrication of integrated circuit devices, and more particularly, to a method of simultaneously recrystallizing the source/drain regions and removing native oxide in the fabrication of integrated circuits.

(2) Description of the Prior Art

In the fabrication of integrated circuit devices, logic products are often produced using salicide (self-aligned silicide) processes in order to obtain higher circuit performance. In silicidation, a refractory metal layer is deposited and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance.

Before metal deposition for silicidation of the source/drain regions, native oxide formed over the source/drain regions must be removed so that lower contact resistance can be obtained. This is usually done using a hydrofluoric acid (HF) dip or by sputter etching. A disadvantage of sputter etching is that plasma damage to the underlying source/drain region may occur. An HF dip does not damage the source/drain region, but is environmentally hazardous.

After source/drain implantation, an annealing process, typically a rapid thermal process (RTP) in nitrogen, must be performed to repair the crystal structure of the silicon in the source/drain regions. It would be desirable to combine the recrystallization and removal of native oxide to be performed simultaneously.

U.S. Pat. No. 5,863,820 to Huang teaches a salicide process. U.S. Pat. No. 5,646,057 to Liu et al teaches a RTP annealing at high temperature followed by annealing at low temperature using $H_2$ to improve performance. No mention is made of removing native oxide. U.S. Pat. No. 5,418,184 to Girisch teaches adding a hydrogen halide to a nitrogen anneal and a subsequent step to remove native oxide. U.S. Pat. No. 5,219,798 to Kamakura describes a method to prevent recrystallization defects by spraying $H_2$ on the underside of a substrate in order to cool it during annealing. U.S. Pat. No. 4,522,657 to Rohatgi et al shows a hydrogen ion implantation followed by a low temperature annealing in nitrogen.

SUMMARY OF THE INVENTION

Accordingly, it is a primary object of the present invention to provide an effective and very manufacturable method for simultaneously annealing a source/drain region and removing an overlying native oxide layer in the fabrication of integrated circuits.

It is a further object of the invention to provide a process for simultaneously annealing a source/drain region and removing an overlying native oxide layer using a $H_2$ anneal in the fabrication of integrated circuits.

Yet another object is to perform a high temperature $H_2$ anneal to anneal the source/drain regions and simultaneously remove native oxide.

Yet another object is to perform an in-situ high temperature $H_2$ anneal to anneal the source/drain regions and simultaneously remove native oxide before a metal layer is deposited.

In accordance with the objects of the invention, a method for simultaneously annealing a source/drain region and removing an overlying native oxide layer using a $H_2$ anneal in the fabrication of integrated circuits is achieved. Semiconductor device structures are provided in and on a semiconductor substrate wherein the semiconductor device structures include gate electrodes and associated source and drain regions. A resist protective dielectric layer is deposited overlying the semiconductor device structures. The resist protective dielectric layer is etched away where it is not covered by a mask exposing a top surface of the gate and a surface of the semiconductor substrate overlying the source and drain regions wherein a native oxide layer forms on the exposed surfaces. The substrate is annealed using $H_2$ whereby the native oxide is removed and whereby the exposed surface of the semiconductor substrate is recrystallized. Thereafter, a metal layer is deposited overlying the resist protective dielectric layer and the exposed surface of the semiconductor substrate and silicided. The metal layer is removed where it is not transformed to a metal silicide leaving the metal silicide overlying the gate, source and drain regions to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
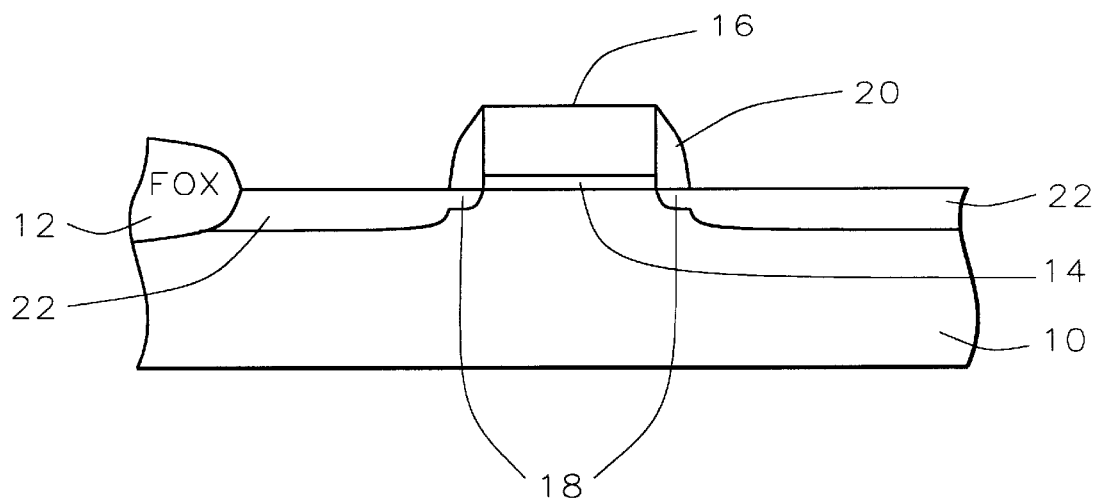
FIGS. 1 through 6 are cross-sectional representations of a preferred embodiment of the present invention.

Referring now more particularly to FIG. 1, there is shown a semiconductor substrate 10, preferably composed of monocrystalline silicon. Isolation regions such as Field OXide regions 12 may be formed as is conventional in the art. A layer of gate oxide 14 is grown over the surface of the substrate, typically to a thickness of between about 40 and 100 Angstroms. A layer of polysilicon 16 is deposited over the gate oxide and field oxide regions to a thickness of between about 1000 and 3000 Angstroms and patterned to form gate electrodes as shown in FIG. 1.

An LDD implant to form the transistor lightly doped regions 18 is performed. Sidewall spacers 20, typically of silicon nitride are formed, followed by implantation of source and drain regions 22.

Figure 2:
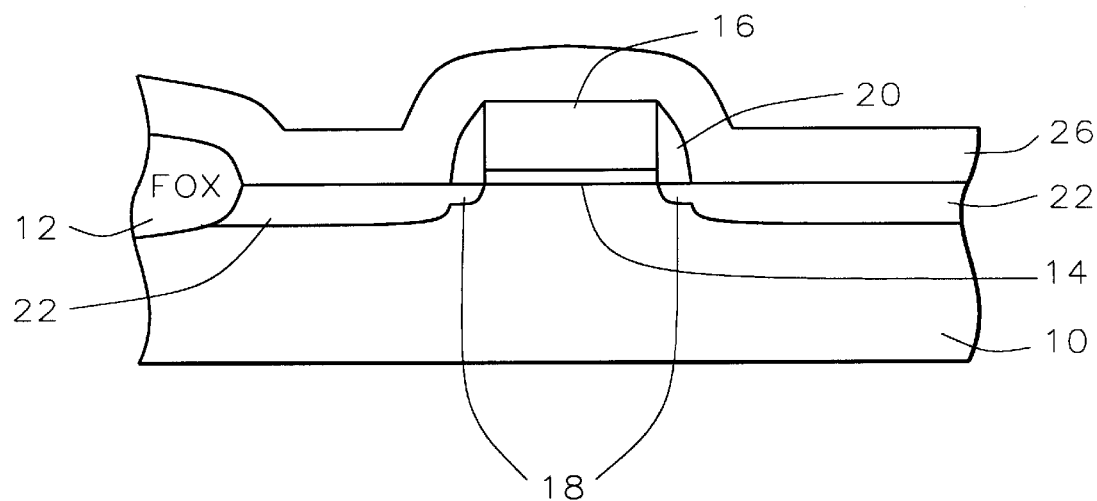

Referring now to FIG. 2, a layer of resist protection dielectric 26 is deposited over the surface of the substrate to a thickness of between about 200 and 500 Angstroms. For example, this may be resist protection oxide (RPO), or another dielectric material such as silicon nitride or silicon oxynitride. RPO is used typically in logic processes to prevent silicidation in certain areas; for example, high resistor elements, ESD devices, input/output (I/O) circuits, etc. The dielectric 26 is etched away where it is not covered by a mask over the gate and source and drain regions, as illustrated in FIG. 3.

Before depositing the metal for salicidation, the crystal structure of the source/drain regions must be repaired. The crystal structure has been damaged by the ion implantation. Conventionally, the source/drain regions are annealed to drive in the dopants before the dielectric etching step. Typically, the annealing is performed in a nitrogen atmosphere.

Figure 3:
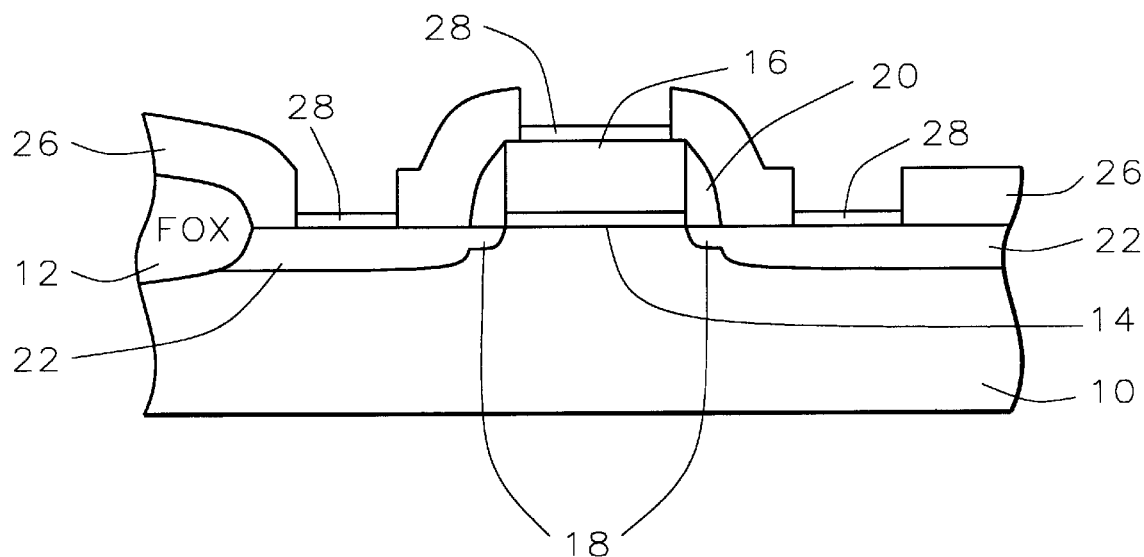

After the dielectric etch, a native oxide layer 28, shown in FIG. 3, forms on the surface of the substrate where it is exposed over the source/drain regions and on the surface of the polysilicon gate. Typically the native oxide layer 28 has a thickness of between about 9 and 15 Angstroms. The native oxide must be removed before the metal is deposited for salicidation in order to lower contact resistance. Conventionally, this is done after the dielectric etch using an HF dip or sputter etch.

Figure 4:
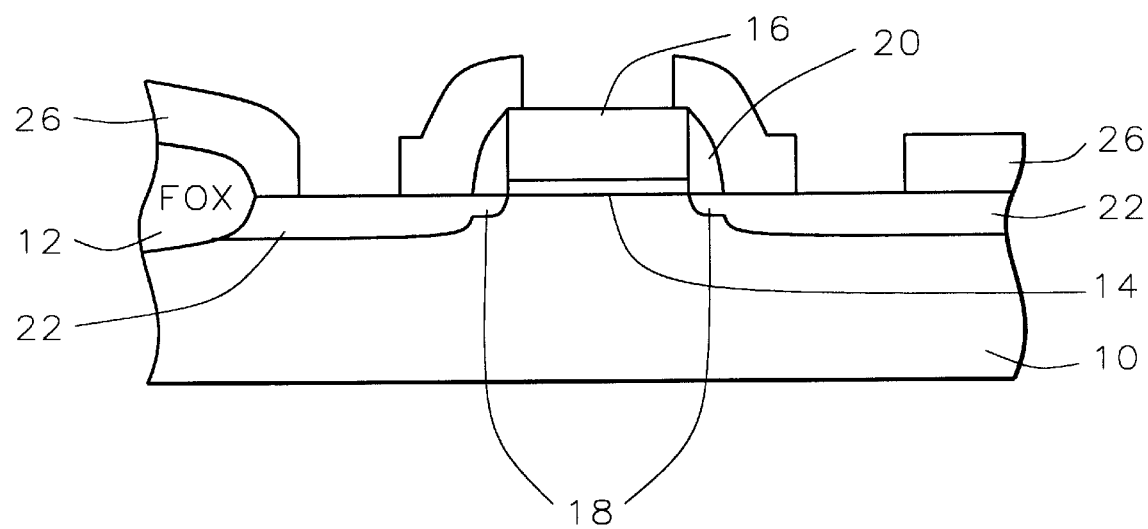

The process of the present invention combines the annealing and native oxide removal steps into one step. In the process of the invention, after the dielectric etch is performed, the substrate is annealed in a hydrogen atmosphere at a temperature of between about 800 and 1150° C. for between about 60 and 120 seconds, and preferably for 10 to 60 seconds. This is a reduced pressure anneal at a pressure of between about 6 and 100 Torr. Hydrogen gas is flowed at 0.1 to 0.99 slm and nitrogen gas is flowed at 0 to 9 slm. The hydrogen annealing removes the native oxide 28 while also recrystallizing the exposed source/drain regions 22 and driving in the dopant as shown in FIG. 4.

The annealing process of the invention removes only the native oxide 28 and does not remove any other structures such as the dielectric 26. The native oxide is much thinner than the dielectric 26, so any loss of the dielectric 26 is negligible.

The annealing may be performed in-situ before the metal layer is deposited in order to save process time. If the annealing is performed in-situ, the wafer is loaded into the metal deposition chamber. The pressure is pumped down to 6 to 100 Torr and the temperature is ramped up to 800 to 1100° C. The $H_2$ anneal is performed as described above. After annealing the wafer, the metal is deposited. The wafer is not exposed to the air after annealing and before metal deposition, so native oxide does not re-form on the exposed surfaces.

The inventors have implemented the process of the invention and have shown that the $H_2$ anneal has the ability to remove the native oxide. Table 1 shows the native oxide thickness before and after the $H_2$ anneal under various conditions.

TABLE 1

| Native oxide thickness (Angstroms) | | |
| --- | --- | --- |
| before anneal | after anneal | $H_2$ anneal conditions |
| 9.8108 | 7.3106 | 800 ° C./60 secs |
| 9.6354 | 6.9452 | 900 ° C./60 secs |
| 9.6202 | 4.5315 | 1050 ° C./60 secs |
| 9.48 | 3.514 | 1050 ° C./120 secs |

By tuning temperature and time, the $H_2$ annealing process of the present invention can remove an adequate amount of the native oxide.

The inventors have also shown that while the $H_2$ anneal removes native oxide, it does not remove thermal oxides grown at less than 500° C.

Figure 5:
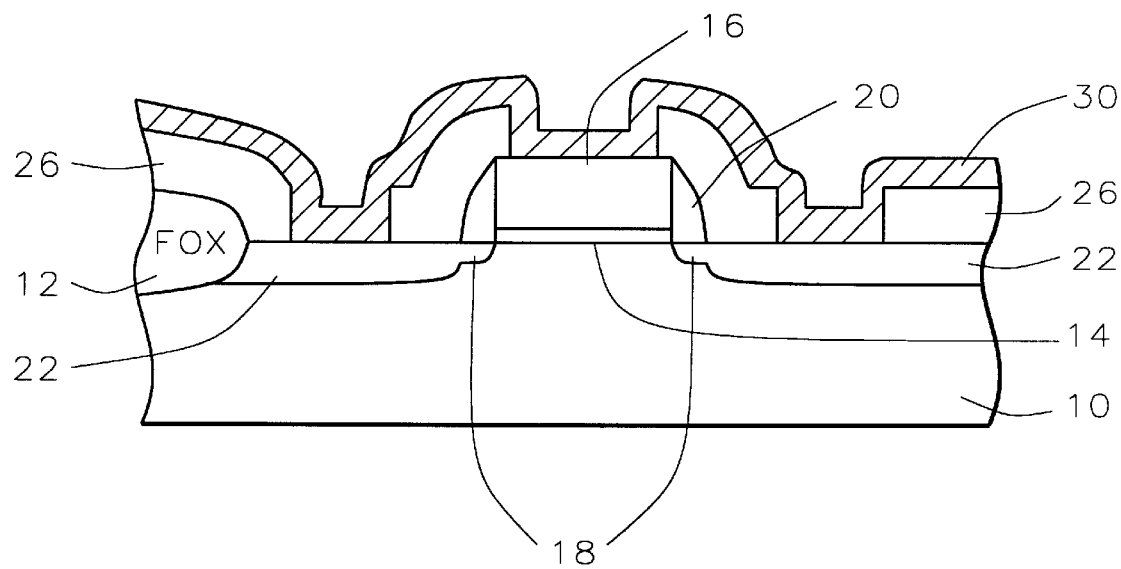

Now, the gate and source/drain regions are ready to be salicided. Referring now to FIG. 5, a titanium, titanium nitride, titanium/titanium nitride, or the like, layer 30 is deposited over the surface of the substrate, typically by sputtering.

Salicidation proceeds as is conventional in the art. For example, the substrate is annealed using a rapid thermal anneal (RTA) in a nitrogen ambient at a temperature of 650 to 750° C. for 10 to 30 seconds. The titanium layer 30 reacts with the silicon in the substrate in the source and drain regions 22 and in the polysilicon gate electrode 16 to form titanium silicide 32 . The titanium overlying the dielectric layer 26 is unchanged.

Figure 6:
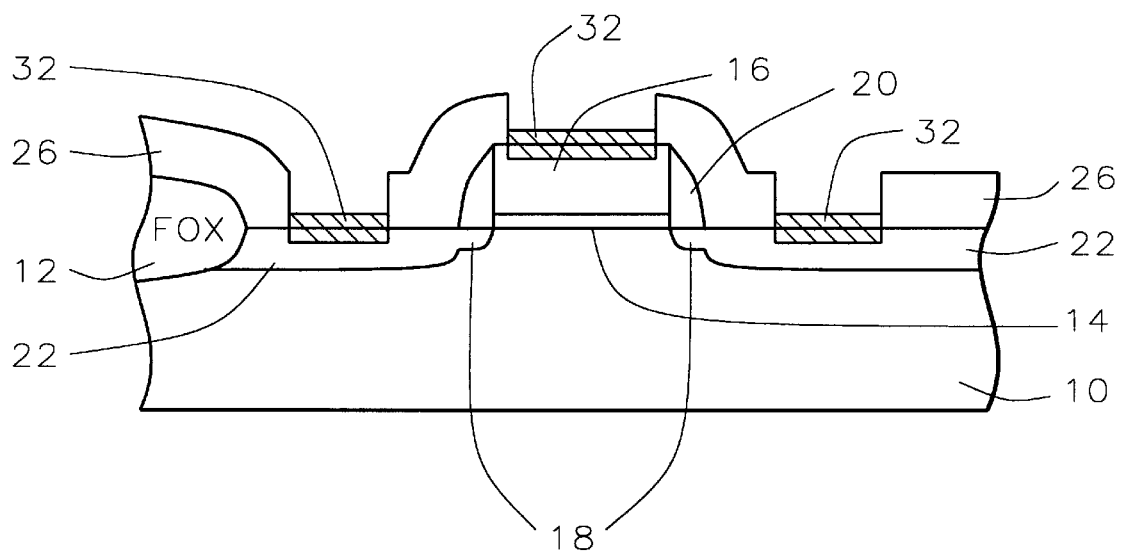

Referring now to FIG. 6, the unreacted titanium 30 is removed, leaving the salicided gate, source and drain regions 32.

The process of the present invention combines the recrystallization anneal and the native oxide removal into one step. The $H_2$ anneal, which can be performed in-situ with metal sputtering, simultaneously repairs crystal damage to the silicon substrate in the source/drain regions and removes the native oxide over the gate and source/drain regions. The number of process steps is reduced without increasing the complexity and cost of the process. The HF dip can be eliminated resulting in a more environmentally friendly process.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing semiconductor device structures in and on a semiconductor substrate wherein said semiconductor device structures include gate electrodes and associated source and drain regions;

depositing a resist protective dielectric layer overlying said semiconductor device structures;

etching away said resist protective dielectric layer where it is not covered by a mask exposing a top surface of said qate electrode and exposing a surface of said semiconductor substrate overlying said source and drain regions wherein a native oxide layer having a thickness of between 9 and 15 Angstroms forms on said exposed surfaces;

annealing said substrate using $H_2$ at a high temperature of 800 to 1150° C. and at a low pressure of 6 to 100 Torr whereby said native oxide thickness is reduced to between 3.5 and 7.3 Angstroms and whereby said exposed surface of said semiconductor substrate is recrystallized simultaneously;

thereafter depositing a metal layer overlying said resist protective dielectric layer, said exposed surface of said gate electrode, and said exposed surface of said semiconductor substrate;

siliciding said metal layer; and removing said metal layer where it is not transformed to a metal silicide leaving said metal silicide overlying said gate electrode and said source and drain regions to complete fabrication of said integrated circuit device.

2. The method according to claim 1 wherein said resist protective dielectric layer has a thickness of between about 200 and 500 Angstroms.

3. The method according to claim 1 wherein said resist protective dielectric layer comprises silicon oxide.

4. The method according to claim 1 wherein said resist protective dielectric layer comprises silicon nitride.

5. The method according to claim 1 wherein said resist protective dielectric layer comprises silicon oxynitride.

6. The method according to claim 1 wherein said step of annealing said substrate using $H_2$ is performed for between about 10 and 60 seconds.

7. The method according to claim 1 wherein said step of annealing said substrate using $H_2$ comprises flowing hydrogen gas at 0.1 to 0.99 slm and flowing nitrogen gas at 0 to 9 slm.

8. The method according to claim 1 wherein said metal layer comprises titanium having a thickness of between about 100 and 500 Angstroms.

9. A method of fabricating silicided gate, source and drain regions in the fabrication of an integrated circuit device comprising:
   providing semiconductor device structures in and on a semiconductor substrate Wherein said semiconductor device structures include gate electrodes and associated said source and drain regions;
   depositing a resist protective dielectric layer overlying said semiconductor device structures;
   etching away said resist protective dielectric layer where it is not covered by a mask exposing a top surface of said gate electrode and exposing a surface of said semiconductor substrate overlying said source and drain regions wherein a native oxide layer having a thickness of between 9 and 15 Angstrom forum on said exposed surfaces;
   thereafter depositing a metal layer overlying said resist protective oxide layer, said surface of said gate electrode, and said posed surface of said semiconductor substrate wherein, in-situ with said depositing of said metal layer, said substrate to annealed using $H_2$ whereby said native oxide thickness is reduced to between 3.5 and 7.3 Angstrom and whereby said exposed surface of said semiconductor substrate is recrystallized simultaneously;
   annealing said metal layer wherein said metal layer reacts with said underlying gate electrode and said semiconductor substrate where it is not covered by said resist protective dielectric layer to form a metal silicide layer;
   removing said metal layer that has not been transformed to said metal silicide layer leaving said metal silicide layer overlying said gate electrode and said source and drain regions to complete fabrication of said silicided gate, source and drain regions in the fabrication of said integrated circuit device.

10. The method according to claim 9 wherein said resist protective dielectric layer has a thickness of between about 200 and 500 Angstroms.

11. The method according to claim 9 wherein said resist protective dielectric layer comprises silicon oxide.

12. The method according to claim 9 wherein said resist protective dielectric layer comprises silicon nitride.

13. The method according to claim 9 wherein said resist protective dielectric layer comprises silicon oxynitride.

14. The method according to claim 9 wherein said in-situ annealing of said substrate using $H_2$ is performed at a temperature of between about 800 and 1100 ° C. at a pressure of between about 6 and 100 Torr, and for between about 10 and 60 seconds.

15. The method according to claim 9 wherein said in-situ annealing of said substrate using $H_2$ comprises flowing hydrogen gas at 0.1 to 0.99 slm and flowing nitrogen gas at 0 to 9 slm.

16. The method according to claim 9 wherein said metal layer comprises titanium having a thickness of between about 100 and 500 Angstroms.

17. A method of fabricating silicided gate, source and drain regions in the fabrication of an integrated circuit device comprising:
   providing semiconductor device structures in and on a semiconductor substrate wherein said semiconductor device structures include gate electrodes and associated said source and drain regions;
   depositing a resist protective dielectric layer overlying said semiconductor device structures;
   etching away said resist protective dielectric layer where it is not covered by a mask exposing a top surface of said gate electrode and exposing a surface of said semiconductor substrate overlying said source and drain regions wherein a native oxide layer forms having a thickness of between 9 and 15 Angstrom on said exposed surfaces;
   thereafter depositing a metal layer overlying said resist protective dielectric layer, said exposed surface of said gate electrode, and said exposed surface of said semiconductor substrate wherein, in-situ with said depositing of said metal layer, said substrate is annealed using $H_2$ at a high temperature of 800 to 1150 ° C. and at a low pressure of 6 to 100 Torr whereby said native oxide thickness is reduced to between 3.5 and 7.3 Angstroms and whereby said exposed surface of said semiconductor substrate is recrystallized simultaneously;
   annealing said metal layer wherein said metal layer reacts with said underlying gate electrode and semiconductor substrate where it is not covered by said resist protective dielectric layer to form a metal silicide layer;
   removing said metal layer that has not been transformed to said metal silicide layer leaving said metal silicide layer overlying said gate electrode and said source and drain regions to complete fabrication of said silicided gate, source and drain regions in the fabrication of said integrated circuit device.

18. The method according to claim 17 wherein said resist protective dielectric layer comprises one of the group containing silicon oxide, silicon nitride, and silicon oxynitride having a thickness of between about 200 and 500 Angstroms.

19. The method according to claim 17 wherein said in-situ annealing of said substrate using $H_2$ comprises flowing hydrogen gas at 0.1 to 0.99 slm and flowing nitrogen gas at 0 to 9 slm for between about 10 and 60 seconds.

20. The method according to claim 17 wherein said metal layer comprises titanium having a thickness of between about 100 and 500 Angstroms.

* * * * *